US006373330B1

(12) United States Patent
Holloway

(10) Patent No.: US 6,373,330 B1
(45) Date of Patent: Apr. 16, 2002

(54) BANDGAP CIRCUIT

(75) Inventor: Peter R. Holloway, Andover, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/772,450

(22) Filed: Jan. 29, 2001

(51) Int. Cl.[7] ............................ G05F 1/10; H01L 35/00

(52) U.S. Cl. ........................ 327/539; 327/512; 323/312

(58) Field of Search ................................ 327/538, 539, 327/540, 541, 543, 512; 323/313, 314, 315

(56) References Cited

U.S. PATENT DOCUMENTS

| | | | | |
|---|---|---|---|---|
| 5,446,368 A | * | 8/1995 | Uscategui | 323/315 |
| 5,500,615 A | * | 3/1996 | Barter | 326/89 |
| 6,278,326 B1 | * | 8/2001 | Murray et al. | 323/315 |

OTHER PUBLICATIONS

Gray, P. et al., "Analysis And Design Of Analog Integrated Circuits" *John Wiley & Sons*, pp. 289–296, 515–522 and 730–737.

* cited by examiner

*Primary Examiner*—Toan Tran
*Assistant Examiner*—Quan Tra
(74) *Attorney, Agent, or Firm*—Skjerven Morrill MacPherson LLP; Edward C. Kwok; Michael J. Halbert

(57) ABSTRACT

A bandgap voltage reference circuit with no error amplifier circuit includes a chain of complementary emitter follower circuits that are connected to a supply voltage and to common ground via respective current mirrors. Each emitter follower circuit within the chain of emitter follower circuits generates a base to emitter voltage. Because of the successive configuration of the chain of emitter follower circuits, the base to emitter voltage differences from all the emitter follower circuits are summed together. Using a chosen number of emitter follower circuits along with an appropriately chosen area for the emitters of the transistors within the emitter follower circuits, the desired proportional to absolute temperature voltage is generated. Further, because of the additive nature of the base to emitter voltage differences, as opposed to a multiplicative nature as found in conventional circuits, the bandgap voltage reference circuit has a decreased level of noise and process sensitivity.

21 Claims, 2 Drawing Sheets

BANDGAP CIRCUIT

FIELD OF THE INVENTION

The present invention relates to a voltage reference circuit and in particular to a bandgap voltage reference circuit that eliminates the need for an error amplifier.

BACKGROUND

Bandgap voltage reference circuits are well known in the art. As is well understood, bandgap voltage reference circuits produce stable voltages that are nearly temperature independent. Stable and temperature independent voltages are useful in voltage regulators, and are commonly used in, for example, integrated circuit technology.

The fundamental principle of a bandgap voltage reference circuit is the summation of one voltage, which is proportional to absolute temperature, with another voltage, which is inversely proportional to absolute temperature. The proportional to absolute temperature first voltage is commonly generated by producing the difference between the base emitter voltages $V_{BE}$ of two bipolar transistor devices and is referred to as $\Delta V_{BE}$. The quantity $\Delta V_{BE}$ can be expressed as:

$$\Delta V_{BE} = \frac{kT}{q}\ln(N) \qquad \text{equ. 1}$$

where k is Boltzmann's constant, T is the absolute temperature, q is the electron charge, and N is the current density ratio of the two devices. As is well known to those skilled in the art, the current density ratio N may be generated by the two devices having a different area but the same current, or by having a different current with the same area. In bipolar technology, a device has a larger area than another device when the device has an emitter that is relatively larger than the emitter of the other device.

The voltage $\Delta V_{BE}$ is scaled with a multiplication factor M an d is then summed with the inversely proportional to absolute temperature second voltage. The second voltage is the base emitter voltage of a bipolar transistor and is referred to as $V_{BE}$. Thus, the reference voltage can be expressed as:

$$V_{REF}=M*\Delta V_{BE}+V_{BE} \qquad \text{equ. 2}$$

The term $M*\Delta V_{BE}$ is often referred to as a proportional-to-absolute-temperature (PTAT) voltage $V_{PTAT}$. The multiplication factor M is an analytically or empirically derived factor that adjusts the proportions of the two components of equation 2 until the temperature coefficient of the resulting sum is nominally zero.

The generation of the voltages $\Delta V_{BE}$ and $V_{BE}$ typically requires that the current in the two transistor devices is precisely the same. To ensure that the collector currents in the two devices are the same, the difference in voltages across equal collector load resistors, e.g., 56 and 58 in FIG. 2 are detected and an error term is generated. The error term is then amplified and applied to the circuit in a closed loop configuration. Thus, conventional bandgap voltage reference circuits require the use of error detection and an amplifier circuit to strictly control the operation of the circuit.

FIG. 1 shows a conventional Widlar bandgap voltage reference circuit 10, which is well known in the art. Widlar voltage reference circuit 10 includes two NPN bipolar transistor devices 12 and 14 with their bases commonly connected to the collector of transistor 12 in a current mirror configuration. The emitter of transistor 12 is connected directly to ground while the emitter of transistor 14 is connected to ground through resistor 16. The collectors of transistors 12 and 14 are connected to a current source 18 through respective resistors 20 and 22. Current source 18 is connected to a voltage source Vcc. A third NPN bipolar transistor 24, acting as an error-feedback device, has its base connected to the collector of transistor 14, while its collector is connected directly to current source 18 and its emitter connected directly to ground.

The operation of Widlar voltage reference circuit 10 is well known in the art. Widlar voltage reference circuit 10 produces a constant bandgap voltage $V_{REF}$ that is equal to the base emitter voltage $V_{BE}$ across transistor 12 and the voltage $V_{PTAT}$ across resistor 20. Transistor 24 shunts an amount of current from current source 18 to ground, which controls the amount of current passing through transistors 12 and 14 and thereby controls the bandgap voltage $V_{REF}$. Transistor 14 is larger than transistor 12 so that the current flowing through the two transistors can be equalized, i.e., to offset the voltage drop across resistor 16. If voltage $V_{REF}$ begins to rise, the current passing through transistor 24 increases, which lowers $V_{REF}$. If on the other hand, voltage $V_{REF}$ begins to decrease, the current passing through transistor 24 will decrease, which will raise $V_{REF}$. Thus, transistor 24 is acting as an error amplifier, controlling the output of Widlar bandgap voltage reference circuit 10.

FIG. 2 shows another well-known bandgap voltage reference circuit. FIG. 2 is a Brokaw bandgap voltage reference circuit 50, which includes two NPN bipolar transistors 52 and 54 with their bases connected. The collectors of transistors 52 and 54 are connected to a voltage supply Vcc via respective resistors 56 and 58. The emitter of transistors 52 is directly connected to node 60, while the emitter of transistor 54 is connected to node 60 through a resistor 62. Another resistor 64 connects node 60 to ground. One input terminal of an error amplifier 66 is connected to the collector of transistor 52, while the other input terminal is connected to the collector of transistor 54. The output of error amplifier 66 produces a bandgap voltage $V_{REF}$, which is fed-back to the bases of transistors 52 and 54. Thus, the output signal from error amplifier 66 provides the base current for transistors 52 and 54.

The operation of Brokaw bandgap voltage reference circuit 50 is well known to those of ordinary skill in the art. Typically in Brokaw circuit 50, resistors 56 and 58 have the same values and transistor 54 has a larger area than transistor 52 so that the currents flowing through transistors 52 and 54 are equalized and transistors 52 and 54 have an area ratio of N. During operation, error amplifier 66 attempts to equalize the current flowing through transistors 52 and 54 by forcing the voltage drop across resistors 56 and 58 to be equal. Thus, the difference in base emitter voltages $\Delta V_{BE}$ is equal to (kT/q)lnN as described in equation 1. The $\Delta V_{BE}$ term is imposed across resistor 62 that connects the two emitters of transistors 52 and 54. The resulting current, which is proportional to absolute temperature is then developed across resistor 64 thereby producing the PTAT voltage $V_{PTAT}$. The bandgap voltage $V_{REF}$ is equal to the base emitter voltage $V_{BE}$ of transistor 52 plus the voltage $V_{PTAT}$ across resistor 64.

As discussed in reference to equation 2, the $V_{PTAT}$ term is equal to $M*\Delta V_{BE}$. The multiplicative term M in bandgap voltage reference circuit 50 can be expressed as:

$$M = 1 + \frac{R_{64}}{R_{62}} \qquad \text{equ. 3}$$

where $R_{64}$ is the resistance of resistor 64, and $R_{62}$ is the resistance of resistor 62. Thus, the ratio of the resistances of resistors 62 and 64 can be adjusted to achieve the desired target M.

As can be seen in FIGS. 1 and 2, conventional bandgap voltage reference circuits 10 and 50 generate two voltages, a base emitter voltage $V_{BE}$ and the PTAT voltage $V_{PTAT}$. The generation of these two voltages requires that the collector currents in the two transistors be controlled through the detection of any differences voltages across equal collector load resistors 56 and 58 in FIG. 2, producing an error term. The error term is amplified in the opposite direction known as "negative feedback" to correct the differences in the base emitter voltages.

Thus, conventional bandgap voltage reference circuits require an error amplifier, which increases the complexity of the circuit, as well as the space and cost requirements. Although the ratio of two such resistors is typically much more precise than the absolute resistance of either resistor, reducing the resulting ratio of error to acceptable levels requires the use of larger area resistors than is desirable, thus adding cost and complexity.

SUMMARY

A bandgap voltage reference circuit includes a chain of complementary emitter follower circuits connected to a supply voltage and to common ground via respective current mirrors and connected to a proportional to absolute temperature resistor. The chain configuration of emitter follower circuits generates a summation of the base to emitter voltage differences provided by the individual emitter follower circuits within the chain. Thus, the Vptat voltage, previously generated by multiplying a single $\Delta V_{BE}$ by a ratio M, is replaced by a summation of multiple individual $\Delta V_{BE}$s formed by each pair of complementary emitter followers such as is formed, e.g., by transistors Q1, Q2, Q3, and Q4 in FIG. 3. Consequently, by adjusting the number of emitter follower circuits along with the area of the transistors used in the emitter follower circuits, the desired PTAT voltage is generated.

The final PTAT voltage is summed with a base to emitter voltage to generate a bandgap voltage reference output signal. Because both NPN and PNP bipolar transistors are used within the bandgap voltage reference circuit, bandgap voltage reference output signals can be generated that are appropriate for both NPN and PNP based devices.

The configuration of a chain of emitter follower circuits connected to current mirrors advantageously eliminates the necessity of a gain error amplifier, which are conventionally used in bandgap voltage reference circuits. Thus, the bandgap voltage reference circuit in accordance with an embodiment of the present invention provides savings in power, cost, and complexity. The use of a number of emitter follower $\Delta V_{BE}$ circuits in a chain to generate the equivalent of $M \times \Delta V_{BE}$ eliminates the need for a precise resistance ratio. Further, the additive nature of the emitter follower $\Delta V_{BE}$ circuits generates lower noise and reduces process sensitivity over conventional bandgap voltage reference circuits.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 3:
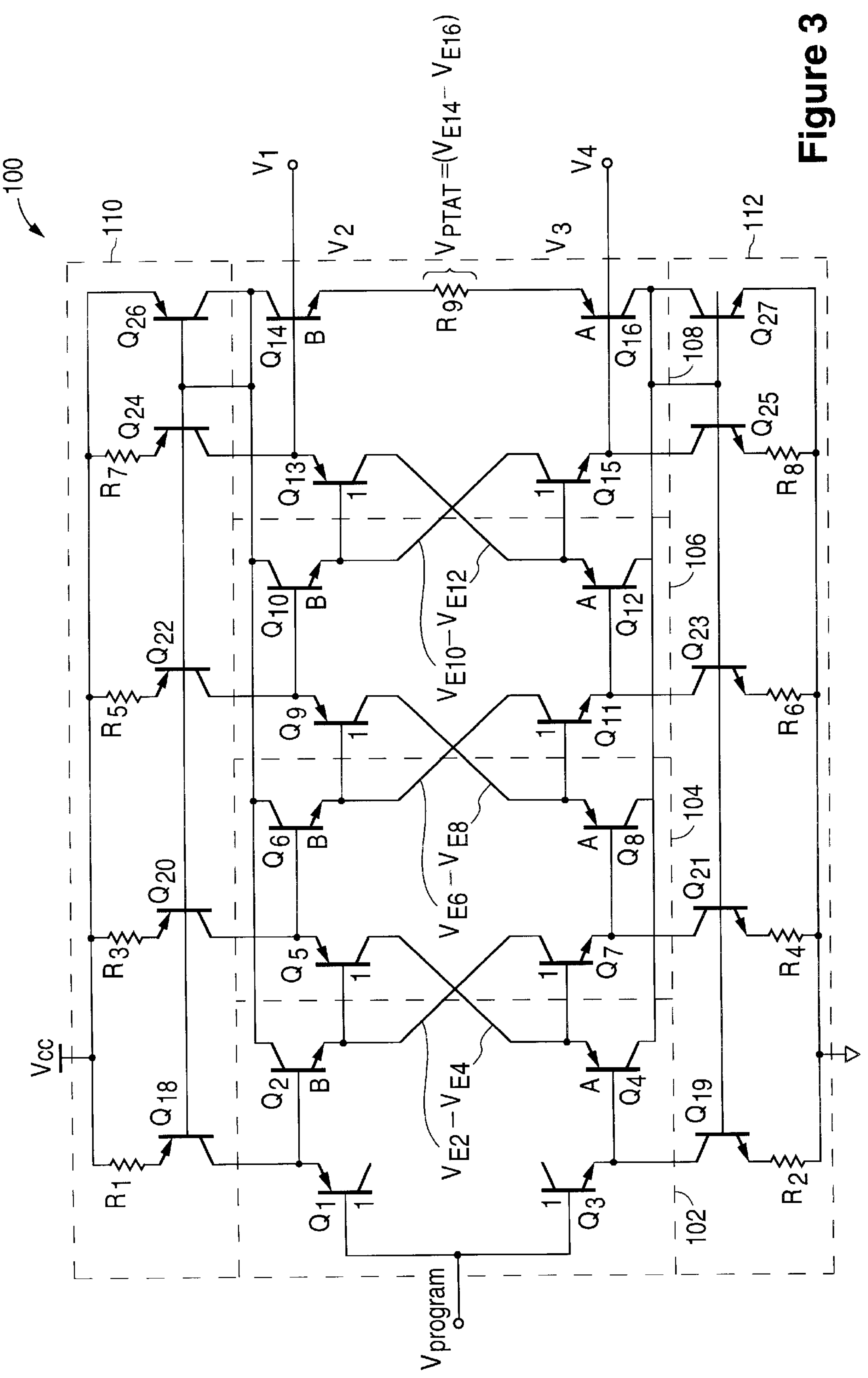
FIG. 3 is a schematic diagram of a bandgap voltage reference circuit using a chain of complementary emitter follower circuits.

FIG. 3 is a schematic diagram of a bandgap voltage reference circuit 100 using bipolar transistors and including a chain of complementary emitter followers illustrated by blocks 102, 104, 106, and 108 in accordance with an embodiment of the present invention.

Emitter follower block 102 receives a program voltage on input terminal $V_{program}$, which is connected to the bases of PNP transistor Q1 and NPN transistor Q3. The areas of transistors Q1 and Q3 are equal and for ease of reference are normalized to a unit area, i.e., the areas of transistors Q1 and Q3 are defined as "1." A second NPN transistor Q2 has its base connected to the emitter of transistor Q1, while a second PNP transistor Q4 has its base connected to the emitter of transistor Q3. Transistor Q2 has an area of B relative to transistors Q1 and Q3, and transistor Q4 has an area of A. The design and manufacture of bipolar transistors of different size or area is understood by those of ordinary skill in the art. By way of an example, in one embodiment the area B of transistor Q2 is 14, while the area A of transistors Q4 is 15 wherein transistors Q1 and Q3 are of unit area, but of course the area B and A may vary, e.g., based on process parameters and the number of stages used. Further, the areas A and B of transistors Q2 and Q4 can be the same if desired.

The emitter of transistor Q1 is connected to the collector PNP transistor Q18. The emitter of transistor Q18 is connected to a voltage supply Vcc via resistor R1 and the base of transistor Q18 is connected to the collector of transistor Q2. Similarly, the emitter of transistor Q3 is connected to the collector of NPN transistor Q19, which is connected to the collector of transistor Q4.

The next emitter follower block in the chain is emitter follower block 104. Emitter follower block 104 includes an PNP transistor Q5 with its base connected to the emitter of transistor Q2 and an NPN transistor Q7 with its base connected the emitter of transistor Q4. The area of transistor Q5 and Q7 are unit area. The collectors of transistors Q5 and Q7 are connected to the respective emitter of transistors Q4 and Q2. Connected to the emitters of transistor Q5 and Q7 are the respective bases of an NPN transistor Q6 and an PNP transistor Q8. The area of transistor Q6 is B, while the area of transistor Q8 is A. The collectors of transistors Q6 and Q8 are connected to the respective collectors of transistor Q2 and Q4.

The emitters of transistors Q5 and Q7 are connected to the respective collectors of transistors Q20 and Q21, where transistor Q20 is an PNP transistors and transistor Q21 is an NPN transistor. A resistor R3 connects the emitter of transistor Q20 to supply voltage Vcc, while resistor R4 connects the emiitter Of transistor Q21 to ground. The bases of transistors Q20 and Q21 are connected to the respective collectors of transistors Q6 and Q8.

The third emitter follower block 106 has a configuration similar to that of emitter follower block 104. The bases of unit area transistors Q9 and Q11 are connected to the emitters of transistors Q6 and Q8, where transistors Q9 and Q11 are respectively PNP and NPN transistors. The collectors of transistors Q9 and Q11 are connected to the respective emitters of transistors Q8 and Q6. The emitter of transistors Q9 and Q11 are connected to the respective bases of an NPN transistor Q10 and PNP transistor Q12. The area of transistors Q10 and Q12 are B and A, respectively. The collectors of transistors Q10 and Q12 are connected to the respective collectors of transistors Q6 and Q8.

The emitters of transistors Q9 and Q11 are connected to the respective collectors of PNP transistor Q22 and NPN transistor Q23. The emitters of transistors Q22 and Q23 are connected to respective supply voltage Vcc and ground via resistors R5 and R6, respectively. The bases of transistors Q22 and Q23 are connected to the respective collectors of transistors Q10 and Q12.

The last emitter follower block 108 shown in FIG. 3 includes a unit area NPN transistors Q13 and a unit area PNP transistor Q15. The bases of transistors Q14 and Q15 are connected to the respective emitters of transistors Q10 and Q11. The collectors of transistors Q13 and Q15 are connected to the respective emitter of transistors Q12 and Q10. An NPN transistor Q14 with an area of B has its base connected to the emitter of transistor Q13, while an PNP transistor Q16 with an area of A has its base connected to the emitter of transistor Q15. The collectors of transistors Q14 and Q16 are connected to the respective collectors of transistors Q10 and Q12. The emitters of transistors Q14 and Q16 are connected across resistor R9, which acts as a proportional-to-absolute-temperature (PTAT) voltage drop resistor, while the bases of transistors Q14 and Q16 are connected to respective output terminals $V_1$ and $V_4$.

The emitters of transistors Q13 and Q15 are connected to the respective emitters of an PNP transistor Q24 and NPN transistor Q25. The emitters of transistors Q24 and Q25 are connected to respective supply voltage Vcc and ground via resistors R7 and R8, respectively. The bases of transistors Q24 and Q25 are connected to the respective collectors of transistors Q14 and Q16. The bases of transistors Q24 and Q25 are also connected to the respective bases of an PNP transistor Q26 and an NPN transistor Q27. The collectors of transistors Q26 and Q27 are connected to the collectors of transistors Q14 and Q16, respectively, while the emitters of transistors Q26 and Q27 are connected directly to supply voltage Vcc and ground, respectively.

It will be recognized by those skilled in the art that transistors Q18, Q20, Q22, Q24, and Q26 are configured as a multiple output current mirror 110. Each of the multiple outputs of current mirror 110 supplies current to respective emitter follower blocks 102, 104, 106, and 108. Transistors Q19, Q21, Q23, Q25, and Q27 are likewise configured in a second multiple output current mirror 112, which supplies current to emitter follower blocks 102, 104, 106, and 108.

As shown in FIG. 3, bandgap voltage reference circuit 100 has an output terminal $V_1$ connected to the base of transistor Q14, an output terminal $V_4$ connected to the base of transistor Q16, as well as two additional output terminals at $V_2$ and $V_3$ at the emitters of transistors Q14 and Q16 respectively.

Bandgap voltage reference circuit 100 operates as follows.

As shown in FIG. 3, the emitters of transistors Q2 and Q4 are connected to the collectors of transistors Q7 and Q5, respectively. Thus, the collector currents of transistors Q7 and Q5 will be approximately equal to the emitter currents of respective transistors Q2 and Q4, assuming that the transistors have a large beta. Bandgap voltage reference circuit 100 has two additional sets of emitter to collector connections, i.e., transistors Q6 and Q8 to respective transistors Q11 and Q9, as well as transistors Q10 and Q12 to respective transistors Q13 and Q15. Each set of emitter to collector connections has the property that the device whose collector is at the junction of collector and emitter is operating at the same current as the device whose emitter is connected to the junction. Consequently, if any of the outputs of multiple output current mirrors 110 or 112 are operating at the desired current, then all of the transistors within the emitter follower blocks 102 through 108 are operating at the desired current.

A voltage $\Delta V_{BE}$ is generated in a step-wise manner by the chain of emitter follower blocks 102 through 108. Examining the operation of emitter follower block 102, it may be assumed that transistors Q1–Q4 in first emitter follower block 102 are operating at the same currents. However, as discussed above, transistors Q1 and Q3 are of unit area, while transistors Q2 and Q4 have areas defined as B and A, respectively. Transistors Q2 and Q3 are both NPN devices, with transistor Q2 having B times the area of transistor Q3. Because transistors Q2 and Q3 are similar type devices, i.e., both are NPN bipolar transistors, there are no other differences between the base emitter voltages of the devices. Consequently, the difference between the base emitter voltages $\Delta V_{BE(Q2/Q3)}$ for transistors Q2 and Q3 can be expressed as (kT/q)(lnB).

Likewise, transistors Q1 and Q4 are similar PNP devices, where the area of transistor Q4 is A times greater than transistor Q1. Thus, the differences between the base emitter voltages AVBE(Q1/Q4) for transistors Q1 and Q4 can be expressed as (kT/q)(InA). Consequently, complementary emitter follower block 102 has a total voltage difference $\Delta V_{BE}$ equal to the summation of the difference between the base emitter voltages $\Delta V_{BE(Q2/Q3)}$ and $\Delta V_{BE(Q1/Q4)}$. Therefore, the first emitter follower block 102 has a total voltage difference $\Delta V_{BE}$ that can be expressed as:

$$\Delta V_{BE} = \frac{kT}{q}(\ln A + \ln B) \qquad \text{equ. 4}$$

where k is Boltzmann's constant, T is the absolute temperature, q is the electron charge, A is the area of transistor Q4, and B is the area of transistor Q2.

Advantageously, the voltage difference $\Delta V_{BE}$ for emitter follower block 102 is independent of any of the base emitter voltages $V_{BE}$ for the transistors block 102 and is also independent of the relationship between the on voltage $V_{BE(On)}$ of the NPNs device or PNP device.

Each successive complementary emitter follower block 104, 106, and 108 will generate in a step-wise fashion a voltage $\Delta V_{BE}$ in a manner similar to that described in reference to emitter follower block 102. Because transistors Q6, Q10, and Q14 have the same area as transistor Q2, and likewise, transistors Q8, Q12, and Q16 have the same area as transistor Q4, the $\Delta V_{BE}$ term for each successive emitter follower block will be proportional to (kT/q)(lnA+lnB) as described in equation 4. However, because each successive emitter follower block increases the $\Delta V_{BE}$ term in a step-wise fashion, the successive $\Delta V_{BE}$ terms from the four complementary emitter follower blocks 102 through 108 are summed together. The sum of all the $\Delta V_{BE}$ terms from the four complementary emitter follower blocks 102 through 108 is the PTAT voltage $V_{PTAT}$ between terminals $V_2$ and $V_3$, as shown in FIG. 3, and may be expressed accordingly.

$$V_{PTAT}=M*\Delta V_{BE}=4\Delta V_{BE}=4\frac{kT}{q}(\ln A+\ln B)=4\frac{kT}{q}\ln(A*B) \quad \text{equ. 5}$$

Thus, bandgap voltage reference circuit 100 has an M value equal to four, which is due to the successive summation of the $\Delta V_{BE}$ terms generated by the four emitter follower blocks 102 through 108. It should be understood that the M value of bandgap voltage reference circuit 100 is not limited to four, but may be altered to any desired integer value by increasing or decreasing the specific number of complementary emitter follower blocks used in bandgap voltage reference circuit 100.

Bandgap voltage reference circuit 100 generates a voltage reference output signal by adding the PTAT voltage $V_{PTAT}$ with a base emitter voltage $V_{BE}$ from a transistor, such as transistor Q14 or Q16. To properly calibrate bandgap voltage reference circuit 100, the value of M is adjusted along with the transistor areas A and B, such that:

$$M*\Delta V_{BE}+V_{BE}= M\frac{kT}{q}(\ln A*B)+V_{BE}=V_{GO}+(\eta-1)\frac{kT}{q}\left(1+\ln\frac{T_0}{T}\right) \quad \text{eqn. 6}$$

where the $V_{BE}$ term is the base emitter voltage of the transistor used in producing reference voltage, $V_{GO}$ is the silicon bandgap energy gap and the term $(\eta-1)(kT/q)(1+\ln(T_0/T))$ is a secondary term for optimum temperature correction well understood in the art and $\eta$ is a composite of temperature dependent terms formed in the standard expression of saturation current of bi-polar devices, as described in "Device Electronics for Integrated Circuits", by Richard Muller and Theodore Kamins, John Wiley & Sons, pages 290–296, which is incorporated herein by reference.

Figure 1:
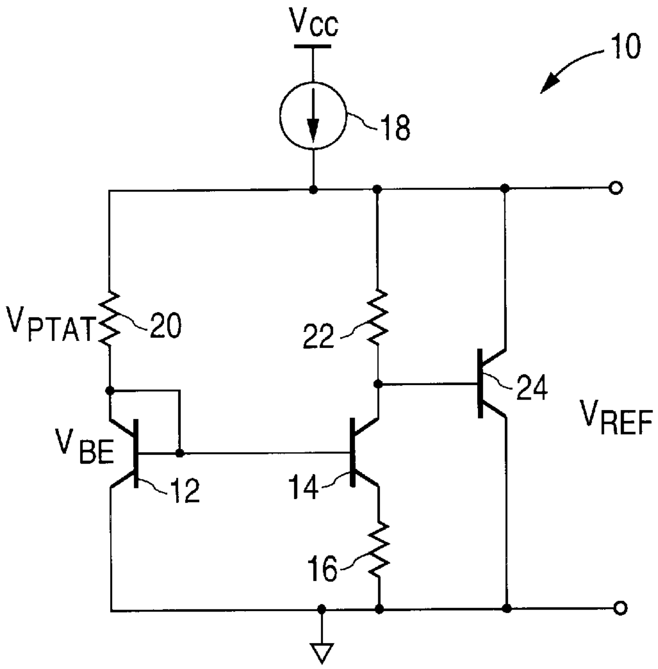
Figure 1 (PRIOR ART)
FIG. 1 is a schematic diagram of a conventional Widlar bandgap voltage reference circuit.
Figure 2:
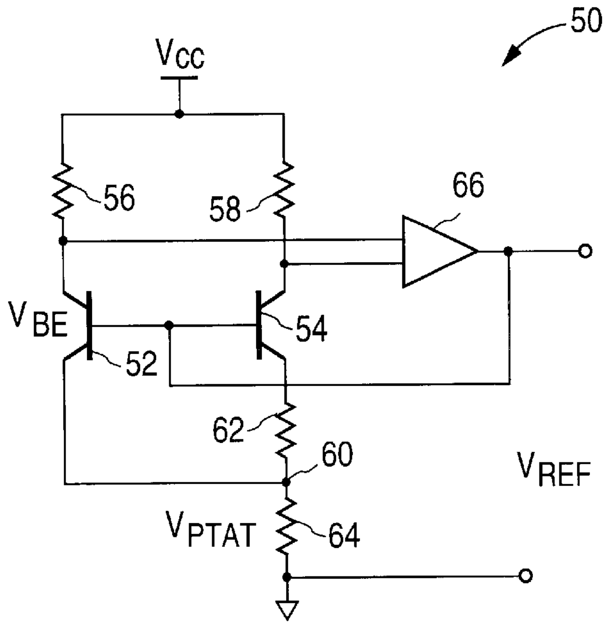
Figure 2 (PRIOR ART)
FIG. 2 is a schematic diagram of a conventional Brokaw bandgap voltage reference circuit.

The PTAT voltage $V_{PTAT}$ of bandgap voltage reference circuit 100 is adjustable by altering the area of the transistors to change the $\Delta V_{BE}$ term and by altering the number of emitter follower blocks to change the M term. Conventional bandgap voltage reference circuits, such as circuit 50 shown in FIG. 2, on the other hand, require altering the ratio of resistances to adjust the M value. However, generating a precise ratio of resistances in an integrated circuit is difficult and is typically not well controlled. Advantageously, bandgap voltage reference circuit 100 avoids the need to adjust the ratio of resistance to generate the M value by easily the number of emitter follower blocks. The PTAT voltage $V_{PTAT}$ is also controlled by altering the area of the transistors, which may be done with a high degree of precision relative to generating a ratio of resistances.

As can be seen in FIG. 3, bandgap voltage reference circuit 100 can generate several distinct output signals. For example, the sum of base emitter voltage $V_{BE}$ from transistor Q14 and the PTAT voltage $V_{PTAT}$ between terminals $V_2$ and $V_3$ would generate a voltage reference output signal at terminals $V_1$–$V_3$. The bandgap voltage $V_1$–$V_3$ is appropriate to NPN based bandgaps because transistor Q14 is an NPN device.

Separately and simultaneously, bandgap voltage reference circuit 100 can generate another voltage reference output signal at terminals $V_2$–$V_4$, where transistor Q16 provides the $V_{BE}$ term. The second bandgap voltage $V_2$–$V_4$ is appropriate for PNP based bandgaps because transistor Q16 is an PNP device.

Another output signal generated by bandgap voltage reference circuit 100 is the PTAT voltage $V_{PTAT}$ between terminals $V_2$ and $V_3$. Additional output signals that can be generated by bandgap voltage reference circuit 100 include the currents flowing out of the collectors of transistors Q14 and Q16, which are approximately equal to the PTAT voltage $V_{PTAT}$ between terminals $V_2$ and $V_3$ divided by the resistance of resistor R9.

The current in transistors Q14 and Q16 are reused in respective current mirrors 110 and 112. For example, the current in transistor Q14 is reflected in current mirror 110 composed of transistors Q26 and Q24. By choosing a larger area for transistor Q24 than for transistor Q26 the current in transistors Q24 and Q25 can be made approximately equal for a given resistance of resistor R7. The same is true for the areas of transistors Q22, Q20, and Q18 of current mirror 110. Likewise, the areas of transistors Q25, Q23, Q21, and Q19 can be chosen such that the current flowing through these transistors is equal to the current flowing through transistor Q27.

Due to the logarithmic nature of current mirrors 110 and 112, there is an insulating effect from errors in the current in transistors Q26 and Q27. For example, when the currents in transistors Q24 and Q26 are made nominally equal, as described above, an incremental change in the current in transistor Q26 causes an attenuated incremental change in the current of transistor Q24, resulting in an attenuation factor described by:

$$\frac{1}{1+\ln\left(\frac{\text{area } Q24}{\text{area } Q26}\right)} \quad \text{equ. 7}$$

where area Q24 is the area of transistor Q24, and area Q26 is the area of transistor Q26. Thus, if the current in transistor Q14 is close to the intended value, the degree of tracking of the current in transistor Q24 to that intended value is much higher than the degree of tracking of the current in transistor Q26. Thus, the reuse of the current in transistors Q14 and Q16 in current mirrors 110 and 112 is a form of feedback with a gain much less than unity. Because of that quality, this feedback is not a negative feedback but is a highly attenuated form of positive feedback, which permits the circuit to converge to a stable operation condition. Thus, bandgap voltage reference circuit 100 does not require the use of a high-gain error amplifier to provide negative feedback as used with conventional bandgap voltage reference circuits thereby providing savings in complexity, power, and cost.

In addition, because the current in transistors Q14 and Q16 is proportional to absolute temperature, the current in the transistors in current mirror 110 as well as the transistors in current mirror 112 will likewise be PTAT. Thus, the operation of current mirrors 110 and 112 is temperature independent.

Another advantage of bandgap voltage reference circuit 100 is that voltage errors are canceled due to the cross coupled nature of the collectors and emitters of the transistors in emitter follower blocks 102 through 108. Thus, for example, if the current in transistor Q7 was twice the desired current, i.e., 2I, then the current in transistor Q2 would likewise be twice the desired current, i.e., 2I. Thus, the change in $V_{BE}$ that transistors Q7 and Q2 would produce would be the same. This change in $V_{BE}$ would be propagated through emitter follower blocks 102, 104, 106, and 108 such that the voltages at terminals $V_2$ and $V_3$, as shown in FIG. 3, would both deviate by an equal magnitude and sign so that the difference between the voltages at terminals $V_2$ and $V_3$ is independent of errors.

Further, because of the additive nature of the successive complementary emitter follower blocks 102 through 108, there is reduced noise and reduced process sensitivity in bandgap voltage reference circuit 100. The difference between base emitter voltages $\Delta V_{BE}$ typically has a large amount of electronic noise. In a conventional bandgap voltage reference circuit the electric noise is multiplied by the multiplicative value M and is, therefore, a significant source of noise in the bandgap reference voltage. However, because of the structure of bandgap voltage reference circuit 100, the summation of the $\Delta V_{BE}$ term generates noise that is equivalent to the root sum squared of the individual components and is therefore less noisy than conventional bandgap voltage reference circuits producing a $\Delta V_{BE}$ voltage with an equivalent magnitude. The same is true for process sensitivity. Conventionally, any process sensitivity of a bandgap voltage reference circuit is multiplied by the M value of the circuit, however, the sensitivity of bandgap voltage reference circuit 100 is equivalent to the root sum squared of the processes sensitivity of the individual components.

Although the present invention has been described in considerable detail with reference to certain versions thereof, other versions are possible. For example, MOSFETs may be used in place of the bipolar transistors as will be understood by those of ordinary skill in the art. Further, the specific number of emitter follower blocks used in bandgap voltage reference circuit 100 is not limited to the number shown in FIG. 3, but is to be adjusted to generate the desired PTAT voltage $V_{PTAT}$. Further, some components are shown directly connected to one another while others are shown connected via intermediate components. In each instance the method of interconnection establishes some desired electrical communication between two or more circuit nodes. Such communication may often be accomplished using a number of circuit configurations, as will be understood by those of ordinary skill in the art. Therefore, the spirit and scope of the appended claims should not be limited to the description of the versions depicted in the figures.

What is claimed is:

1. A circuit comprising:

an input terminal for receiving a program voltage;

a first complementary emitter follower circuit coupled to said input terminal;

a second complementary emitter follower circuit coupled to said first complementary emitter follower circuit;

a first current mirror circuit coupled to said first emitter follower circuit and said second emitter follower circuit, said first current mirror circuit coupled to a voltage supply;

a second current mirror circuit coupled to said first emitter follower circuit and said second emitter follower circuit, said second current mirror circuit coupled to a common voltage; and a resistor coupled to said second complementary emitter follower circuit, said resistor acting as a proportional-to-absolute-temperature voltage drop resistor.

2. The circuit of claim 1, wherein said first complementary emitter follower circuit comprises:

a first transistor having a first terminal and a second terminal, said first terminal coupled to said input terminal, said second terminal coupled to said first current mirror circuit;

a second transistor having a first terminal, a second terminal, and a third terminal, said first terminal coupled to said second terminal of said first transistor, said third terminal coupled to said first current mirror circuit;

a third transistor having a first terminal and a second terminal, said first terminal coupled to said input terminal, said second terminal coupled to said second current mirror circuit; and a fourth transistor having a first terminal, a second terminal, and a third terminal, said first terminal coupled to said second terminal of said first transistor, said third terminal coupled to said second current mirror circuit.

3. The circuit of claim 2, wherein said first transistor is an PNP bipolar transistor with an emitter having a first area, said second transistor is an NPN bipolar transistor with an emitter having a second area, said third transistor is an NPN bipolar transistor with an emitter having said first area, and said fourth transistor is an PNP bipolar transistor with an emitter having a third area.

4. The circuit of claim 2, wherein said second complementary emitter follower circuit comprises:

a fifth transistor having a first terminal, a second terminal, and a third terminal, said first terminal coupled to said second terminal of said second transistor, said second terminal coupled to said first current mirror circuit, and said third terminal coupled to said second terminal of said fourth transistor;

a sixth transistor having a first terminal, a second terminal, and a third terminal, said first terminal coupled to said second terminal of said fifth transistor, said third terminal coupled to said third terminal of said second transistor;

a seventh transistor having a first terminal, a second terminal, and a third terminal, said first terminal coupled to said second terminal of said fourth transistor, said second terminal coupled to said second current mirror circuit, and said third terminal coupled to said second terminal of said second transistor; and an eighth transistor having a first terminal, a second terminal, and a third terminal, said first terminal coupled to said second terminal of said seventh transistor, said third terminal coupled to said third terminal of said fourth transistor.

5. The circuit of claim 4, wherein said fifth transistor is an PNP bipolar transistor with an emitter having a first area, said sixth transistor is an NPN bipolar transistor with an emitter having a second area, said seventh transistor is an NPN bipolar transistor with an emitter having said first area, and said eighth transistor is an PNP bipolar transistor with an emitter having a third area.

6. The circuit of claim 4, wherein said resistor is disposed between said second terminal of said sixth terminal and said second terminal of said eighth transistor.

7. The circuit of claim 1, further comprising a third complementary emitter follower circuit disposed between said second complimentary emitter follower circuit and said resistor, said third complementary emitter follower circuit coupled to said first current mirror circuit and said second current mirror circuit.

8. The circuit of claim 4, further comprising a third complementary emitter follower circuit disposed between said second complimentary emitter follower circuit and said resistor, said third complementary emitter follower circuit coupled to said first current mirror circuit and said second current mirror circuit , wherein said third complementary emitter follower circuit comprises:

a ninth transistor having a first terminal, a second terminal, and a third terminal, said first terminal coupled to said second terminal of said sixth transistor, said second terminal coupled to said first current mirror circuit, and said third terminal coupled to said second terminal of said eighth transistor;

a tenth transistor having a first terminal, a second terminal, and a third terminal, said first terminal coupled to said second terminal of said ninth transistor, said third terminal coupled to said third terminal of said sixth transistor;

a eleventh transistor having a first terminal, a second terminal, and a third terminal, said first terminal coupled to said second terminal of said eighth transistor, said second terminal coupled to said second current mirror circuit, and said third terminal coupled to said second terminal of said sixth transistor; and a twelfth transistor having a first terminal, a second terminal, and a third terminal, said first terminal coupled to said second terminal of said eleventh transistor, said third terminal coupled to said third terminal of said eighth transistor.

9. The circuit of claim 8, wherein said ninth transistor is an PNP bipolar transistor with an emitter having a first area, said tenth transistor is an NPN bipolar transistor with an emitter having a second area, said eleventh transistor is an NPN bipolar transistor with an emitter having said first area, and said twelfth transistor is an PNP bipolar transistor with an emitter having a third area.

10. The circuit of claim 8, wherein said resistor is disposed between said second terminal of said tenth transistor and said second terminal of said twelfth transistor.

11. The circuit of claim 7, further comprising a fourth complementary emitter follower circuit disposed between said third complimentary emitter follower circuit and said resistor, said fourth complementary emitter follower circuit coupled to said first current mirror circuit and said second current mirror circuit.

12. The circuit of claim 8, further comprising a fourth complementary emitter follower circuit disposed between said third complimentary emitter follower circuit and said resistor, said fourth complementary emitter follower circuit coupled to said first current mirror circuit and said second current mirror circuit, wherein said fourth complementary emitter follower circuit comprises:

a thirteenth transistor having a first terminal, a second terminal, and a third terminal, said first terminal coupled to said second terminal of said tenth transistor, said second terminal coupled to said first current mirror circuit, and said third terminal coupled to said second terminal of said twelfth transistor;

a fourteenth transistor having a first terminal, a second terminal, and a third terminal, said first terminal coupled to said second terminal of said thirteenth transistor, said third terminal coupled to said third terminal of said tenth transistor;

a fifteenth transistor having a first terminal, a second terminal, and a third terminal, said first terminal coupled to said second terminal of said twelfth transistor, said second terminal coupled to said second current mirror circuit, and said third terminal coupled to said second terminal of said tenth transistor; and a sixteenth transistor having a first terminal, a second terminal, and a third terminal, said first terminal coupled to said second terminal of said fifteenth transistor, said third terminal coupled to said third terminal of said twelfth transistor.

13. The circuit of claim 12, wherein said resistor is disposed between said second terminal of said fourteenth transistor and said second terminal of said sixteenth transistor.

14. The circuit of claim 12, wherein said thirteenth transistor is an PNP bipolar transistor with an emitter having a first area, said fourteenth transistor is an NPN bipolar transistor with an emitter having a second area, said fifteenth transistor is an NPN bipolar transistor with an emitter having said first area, and said sixteenth transistor is an PNP bipolar transistor with an emitter having a third area.

15. The circuit of claim 12, wherein said first current mirror circuit comprises:

a seventeenth transistor having a first terminal, a second terminal, and a third terminal, said first terminal coupled to said third terminal of said fourteenth transistor, said second terminal coupled to said voltage supply, and said third terminal coupled to said third terminal of said fourteenth transistor;

an eighteenth transistor having a first terminal, a second terminal, and a third terminal, said first terminal coupled to said first terminal of said seventeenth transistor, said second terminal coupled to said voltage supply, and said third terminal coupled to second terminal of said thirteenth transistor;

a nineteenth transistor having a first terminal, a second terminal, and a third terminal, said first terminal coupled to said first terminal of said seventeenth transistor, said second terminal coupled to said voltage supply, and said third terminal coupled to second terminal of said ninth transistor;

a twentieth transistor having a first terminal, a second terminal, and a third terminal, said first terminal coupled to said first terminal of said seventeenth transistor, said second terminal coupled to said voltage supply, and said third terminal coupled to second terminal of said fifth transistor; and a twenty first transistor having a first terminal, a second terminal, and a third terminal, said first terminal coupled to said first terminal of said seventeenth transistor, said second terminal coupled to said voltage supply, and said third terminal coupled to second terminal of said first transistor; and wherein said second current mirror circuit comprises:

a twenty second transistor having a first terminal, a second terminal, and a third terminal, said first terminal coupled to said third terminal of said fourteenth transistor, said second terminal coupled to said common voltage, and said third terminal coupled to said third terminal of said sixteenth transistor;

a twenty third transistor having a first terminal, a second terminal, and a third terminal, said first terminal coupled to said first terminal of said twenty second transistor, said second terminal coupled to said common voltage, and said third terminal coupled to second terminal of said fifteenth transistor;

a twenty fourth transistor having a first terminal, a second terminal, and a third terminal, said first terminal coupled to said first terminal of said twenty second transistor, said second terminal coupled to said common voltage, and said third terminal coupled to second terminal of said eleventh transistor;

a twenty fifth transistor having a first terminal, a second terminal, and a third terminal, said first terminal coupled to said first terminal of said twenty second transistor, said second terminal coupled to said common voltage, and said third terminal coupled to second terminal of said seventh transistor; and a twenty sixth transistor having a first terminal, a second terminal, and a third terminal, said first terminal coupled to said first terminal of said twenty second transistor, said second terminal coupled to said common voltage, and said third terminal coupled to second terminal of said second transistor.

16. A method comprising:

generating a first base to emitter voltage;

generating a second base to emitter voltage, said second base to emitter voltage being complementary to said first base to emitter voltage, said first base to emitter voltage and said second base to emitter voltage being a first base to emitter voltage difference;

generating a third base to emitter voltage;

generating a fourth base to emitter voltage, said fourth base to emitter voltage being complementary to said third base to emitter voltage, said third base to emitter voltage and said fourth base to emitter voltage being a second base to emitter voltage difference; and summing said first and second base to emitter voltage differences to generate a proportional to absolute temperature voltage.

17. The method of claim 16, further comprising adding said proportional to absolute temperature voltage to a base to emitter voltage to generate a bandgap voltage reference output signal.

18. The method of claim 17, wherein a bandgap voltage reference signal for NPN based devices is generated along with a bandgap voltage reference signal for PNP based devices.

19. The method of claim 16, wherein generating said first base to emitter voltage comprises drawing a first current through a first bipolar emitter follower circuit, generating said second base to emitter voltage comprises drawing a second current through a second bipolar emitter follower circuit, generating said third base to emitter voltage comprises drawing a third current through a third bipolar emitter follower circuit, generating said fourth base to emitter voltage comprises drawing a fourth current through a fourth bipolar emitter follower circuit.

20. The method of claim 19, wherein said first current is the same as said third current and said second current is the same as said fourth current.

21. The method of claim 19, wherein the magnitude of said proportional to absolute temperature voltage is adjusted by altering the area of the emitters in said emitter follower circuits and by altering the number of emitter follower circuits.

* * * * *